United States Patent
Huang

(10) Patent No.: US 11,735,085 B1
(45) Date of Patent: Aug. 22, 2023

(54) OUTPUT BUFFER CAPABLE OF REDUCING POWER CONSUMPTION OF A DISPLAY DRIVER

(71) Applicant: Ying-Neng Huang, Taichung (TW)

(72) Inventor: Ying-Neng Huang, Taichung (TW)

(*) Notice: Subject to any disclaimer, the term of this patent is extended or adjusted under 35 U.S.C. 154(b) by 0 days.

(21) Appl. No.: 17/721,366

(22) Filed: Apr. 15, 2022

(51) Int. Cl.
*G09G 3/20* (2006.01)
*H03F 3/45* (2006.01)
*G05F 1/613* (2006.01)
*H03K 19/20* (2006.01)

(52) U.S. Cl.
CPC ............... *G09G 3/20* (2013.01); *G05F 1/613* (2013.01); *H03F 3/45475* (2013.01); *H03K 19/20* (2013.01); *G09G 2310/0291* (2013.01); *G09G 2330/021* (2013.01)

(58) Field of Classification Search
CPC ...... G09G 3/36; G09G 3/3611; G09G 3/3614; G09G 3/3622; G09G 3/3625; G09G 3/364; G09G 3/3644; G09G 3/3648; G09G 2310/0291
USPC .................................................. 345/87–104
See application file for complete search history.

(56) References Cited

U.S. PATENT DOCUMENTS

| | | | | |
|---|---|---|---|---|
| 6,496,173 B1* | 12/2002 | Albu | .................... | G09G 3/3688 345/98 |
| 2003/0011554 A1* | 1/2003 | Albu | .................... | G09G 3/2011 345/89 |
| 2003/0076285 A1* | 4/2003 | Albu | .................... | H03F 3/72 345/87 |
| 2010/0237939 A1* | 9/2010 | Johansson | ........... | H03F 3/45475 330/192 |
| 2011/0298781 A1* | 12/2011 | Park | .................... | G09G 3/3688 345/212 |
| 2013/0147697 A1 | 6/2013 | Sung | | |
| 2014/0111718 A1* | 4/2014 | Chen | .................... | G02F 1/133 349/39 |
| 2015/0015566 A1 | 1/2015 | Hsieh | | |
| 2021/0385924 A1 | 12/2021 | Seminara | | |

FOREIGN PATENT DOCUMENTS

| | | |
|---|---|---|
| TW | M560677 U | 5/2018 |
| TW | 201939885 A | 10/2019 |
| TW | 202008333 A | 2/2020 |

* cited by examiner

*Primary Examiner* — Amit Chatly
*Assistant Examiner* — Nelson Lam
(74) *Attorney, Agent, or Firm* — Winston Hsu

(57) ABSTRACT

An output buffer for a source driver of a panel includes an output stage, configured to output an output voltage; an operational transconductance amplifier (OTA), configured to control the output stage to charge or discharge a capacitor of a pixel of the panel; and a detector, coupled between the OTA and the output stage, configured to output an enabling signal to turn on/off the output buffer after the output buffer finishes charging or discharging the capacitor of the pixel of the panel, wherein the enabling signal is determined according to a current value of the output stage.

16 Claims, 8 Drawing Sheets

OUTPUT BUFFER CAPABLE OF REDUCING POWER CONSUMPTION OF A DISPLAY DRIVER

BACKGROUND OF THE INVENTION

1. Field of the Invention

The present invention relates to an output buffer, and more particularly, to an output buffer capable of reducing power consumption of a display driver.

2. Description of the Prior Art

Conventional mainstream display devices, e.g. liquid-crystal display (LCD) and organic light-emitting diode (OLED), are capacitive load display devices. The industry usually adopts an equivalent circuit with resistors and capacitors in a multi-order for different manufacturing processes and panel sizes, wherein a total resistance is around 2-10 Kohm and a total capacitance is around 10-120 pF.

A display driver of the conventional display device utilizes a digital-to-analog converter (DAC) to convert digital gray data into analog pixel voltages for charging or discharging pixels of the panels by an output buffer to increase a driving ability. Please refer to FIG. 1, which is a schematic diagram of a conventional output buffer OB. The conventional output buffer OB includes an operational transconductance amplifier OTA and an output stage OS. FIG. 2 is a schematic diagram of a voltage waveform and a current waveform of the output buffer OB in FIG. 1.

As shown in FIG. 2, the output buffer OB still consumes a fixed static current (e.g. 2-10 µA) after charging or discharging the capacitors of the pixels and generates extra power consumption.

Therefore, improvements are necessary to the prior art.

SUMMARY OF THE INVENTION

Therefore, the present invention provides an output buffer to reduce power consumption of a display driver.

An embodiment of the present invention provides an output buffer for a source driver of a panel includes an output stage, configured to output an output voltage; an operational transconductance amplifier (OTA), configured to control the output stage to charge or discharge a capacitor of a pixel of the panel; and a detector, coupled between the OTA and the output stage, configured to output an enabling signal to turn on/off the output buffer after the output buffer finishes charging or discharging the capacitor of the pixel of the panel, wherein the enabling signal is determined according to an output current of the output stage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
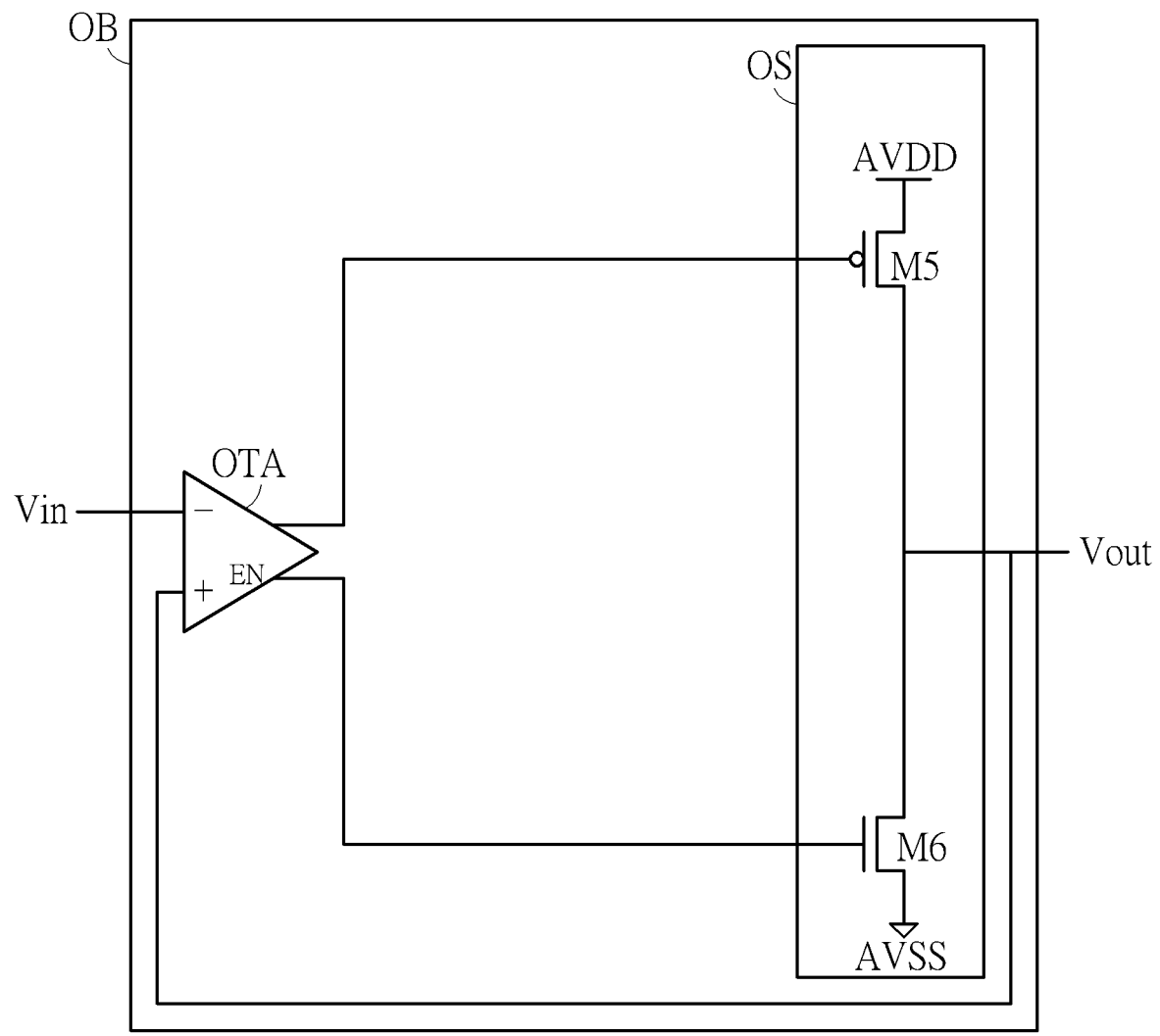
FIG. 1 is a schematic diagram of a conventional output buffer.
Figure 2:
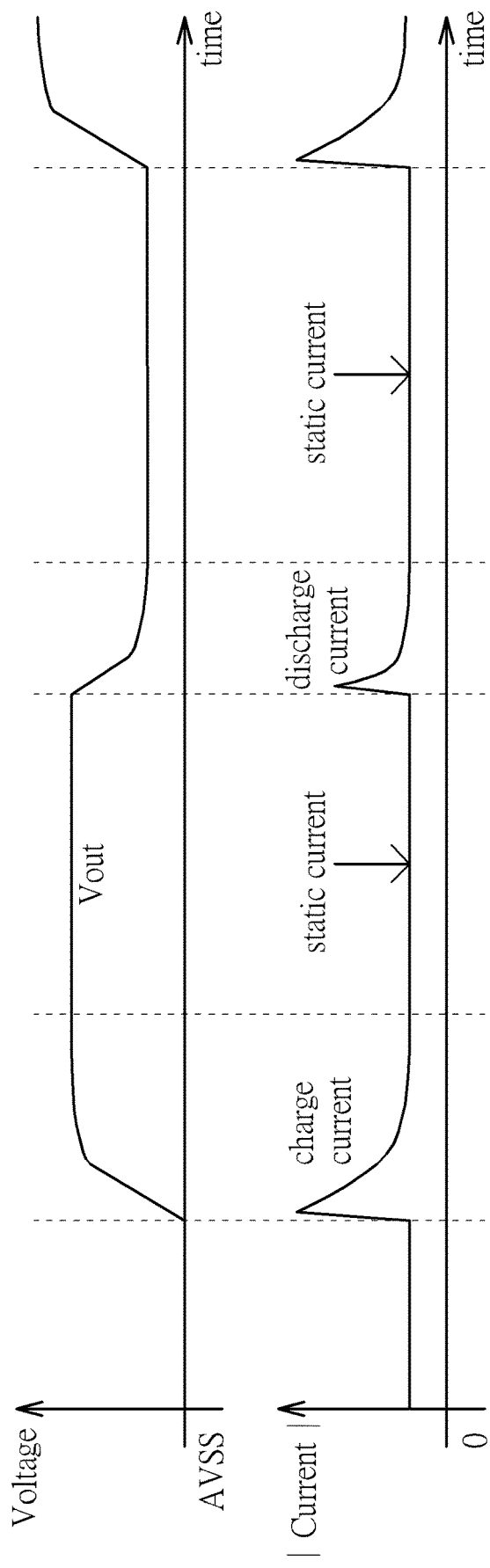
FIG. 2 is a schematic diagram of a voltage waveform and a current waveform of the conventional output buffer in FIG. 1
Figure 3:
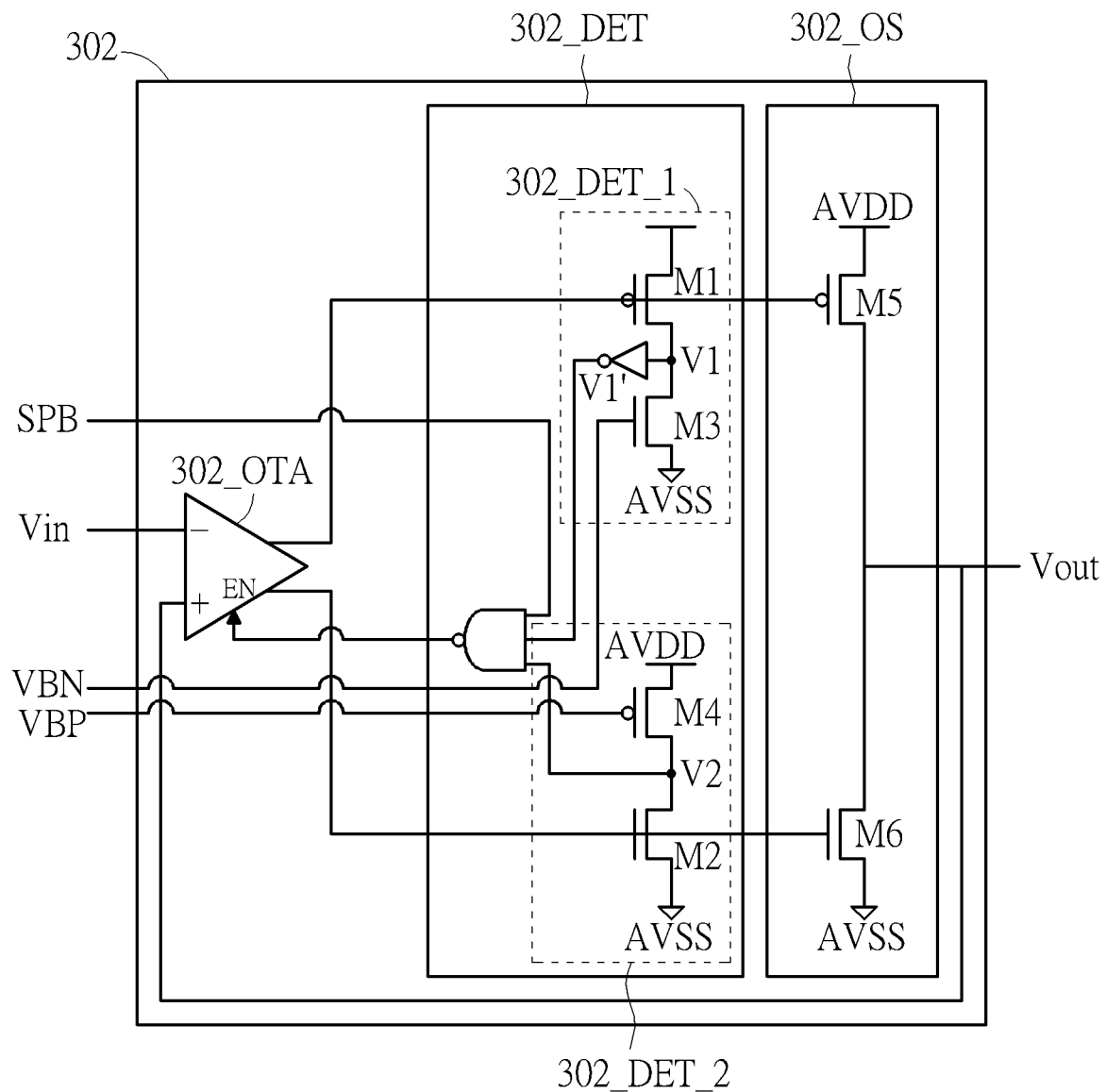
FIG. 3 is a schematic diagram of an output buffer according to an embodiment of the present invention.

Please refer to FIG. 3, which is a schematic diagram of an output buffer 302 according to an embodiment of the present invention. The output buffer 302 may be utilized for a source driver of a panel, e.g. a liquid-crystal display (LCD) and an organic light-Emitting diode (OLED). The output buffer 302 includes an output stage 302_OS, an operational transconductance amplifier (OTA) 302_OTA and a detector 302_DET. The output stage 302_OS is configured to output an output voltage Vout to a pixel of the panel. The OTA 302_OTA is configured to control the output stage 302_OS to charge or discharge a capacitor of the pixel of the panel. The detector 302_DET is coupled between the OTA 302_OTA and the output stage 302_OS and is configured to output an enabling signal EN to turn on/off the output buffer 302 after the output buffer 302 finishes charging or discharging the capacitor of the pixel of the panel, wherein the enabling signal EN is determined according to an output current of the output stage 302_OS.

The detector 302_DET includes a charging detector 302_DET_1, a discharging detector 302_DET_2 and a logic NAND. The charging detector 302_DET_1 is configured to determine a non-first voltage V1' according to a charging current of the output stage 302_OS and a first bias voltage VBN. The discharging detector 302_DET_2 is configured to determine a second division voltage V2 according to a discharging current of the output stage 302_OS and a second bias voltage VBP of the bias circuit. The logic NAND is configured to determine the enabling signal EN according to the non-first voltage V1', the second division voltage V2 and an enabling pulse signal SPB.

The charging detector 302_DET_1 includes a first current source M1, a first current sink M3 and a logic NOT. The logic NOT is coupled to the first current source M1 and the first current sink M3, and is configured to determine the non-first voltage V1' according to a first division voltage V1 of the first current source M1 and the first current sink M3. In an embodiment, the first current source M1 may be a P-type metal-oxide-semiconductor (PMOS) and the first current sink M3 may be an N-type metal-oxide-semiconductor (NMOS). The discharging detector 302_DET_2 includes a second current sink M2 and a second current source M4, and is configured to determine the second division voltage V2 according to the second current sink M2 and the second current source M4. In an embodiment, the second current sink M2 may be an NMOS and the second current source M4 may be a PMOS.

The detector 302_DET is configured to detect an output current of the output buffer 302. The first current source M1 and the second current sink M2 respectively reflect currents of a first output transistor M5 and a second output transistor M6 of the output stage 302_OS. In an embodiment, the first output transistor M5 may be a PMOS and the second output transistor M6 may be an NMOS. The first current sink M3 and the second current source M4 respectively generate a reference current according to the first bias voltage VBN and the second bias voltage VBP. The detector 302_DET is configured to output the enabling signal EN according to the enabling pulse signal SPB, the first division voltage V1 and the second division voltage V2. In addition, the enabling signal EN is utilized for controlling ON/OFF of the output buffer OB.

Figure 4:
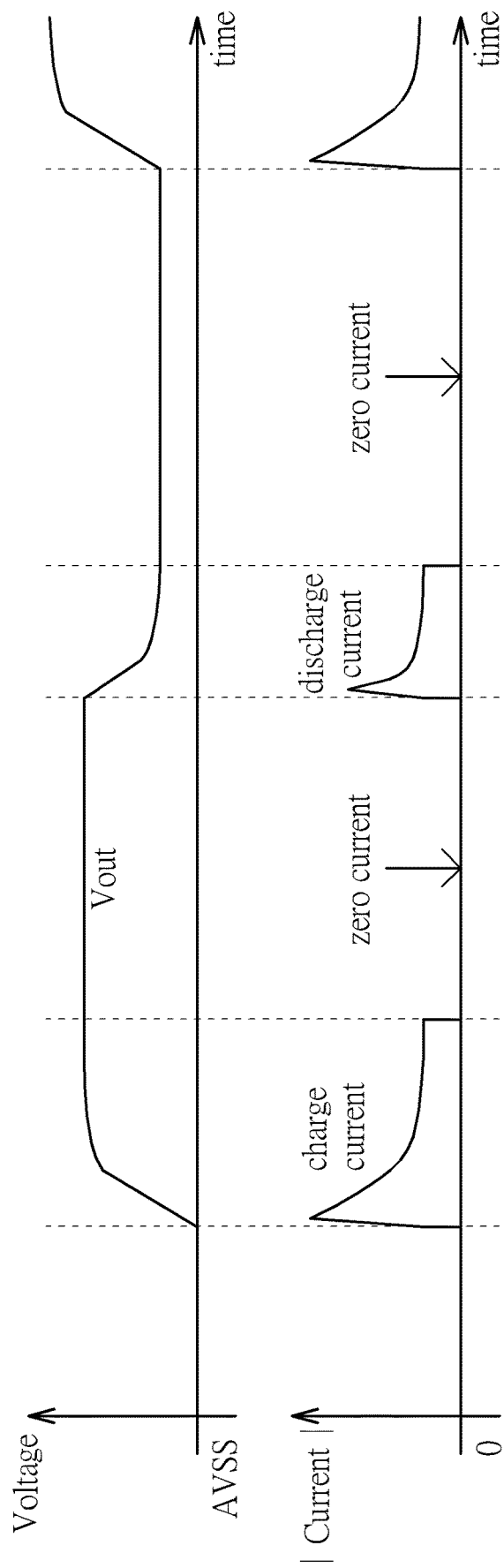
FIG. 4 is a schematic diagram of a voltage waveform and a current waveform of the output buffer in FIG. 3 according to an embodiment of the present invention.

FIG. 4 is a schematic diagram of a voltage waveform and a current waveform of the output buffer 302 in FIG. 3 according to an embodiment of the present invention. Notably, the current waveform shown in FIG. 4 is an absolute value of the current.

As shown in FIG. 4, the output voltage Vout of the output buffer 302 is varied in response to the current waveform, wherein the current waveform is related to a variation of the output voltage Vout. With the detector 302_DET, the output buffer 302 according to an embodiment of the present invention is turned on/off after the output buffer 302 finishes charging/discharging the capacitor of the pixel of the panel, which reduces the power consumption of the output buffer 302. In other words, a static current of the output buffer 302 is around zero when the output buffer 302 is turned off after the output buffer 302 finishes charging or discharging the capacitor of the pixel of the panel.

Figure 5:
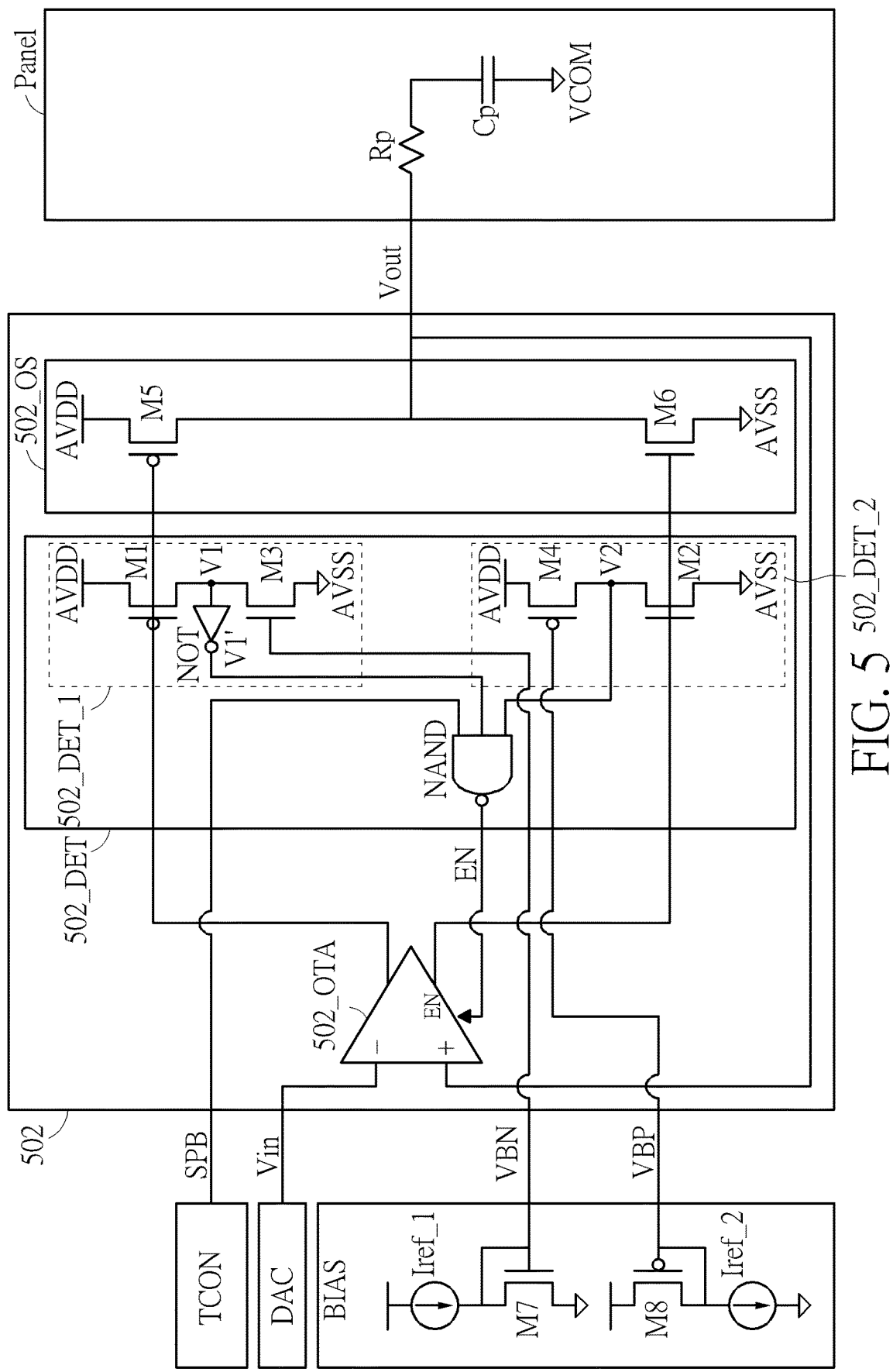
FIG. 5 is a schematic diagram of an output buffer according to an embodiment of the present invention.

Refer to FIG. 5, which is a schematic diagram of the output buffer 502 according to an embodiment of the present invention. The output buffer 502 is an alternative embodiment of the output buffer 302. The output buffer 502 includes an output stage 502_OS, an OTA 502_OTA and a detector 502_DET. The output stage 502_OS is configured to output an output voltage Vout. The OTA 502_OTA is configured to control the output stage 502_OS to charge or discharge a capacitor Cp of a pixel of a panel according to an input voltage Vin from a digital-to-analog converter DAC. The detector 502_DET is configured to output an enabling signal EN to turn on/off the output buffer 502 after the output buffer 502 finishes charging or discharging the capacitor of the pixel of the panel, wherein the enabling signal EN is determined according to an output current of the output stage 502_OS.

The detector 502_DET includes a charging detector 502_DET_1, a discharging detector 502_DET_2 and a logic NAND. The charging detector 502_DET_1 is configured to determine a non-first voltage V1' according to a charging current of the output stage 502_OS and a first bias voltage VBN, wherein the first bias voltage VBN is generated by a first reference transistor M7 of a bias circuit BIAS. In an embodiment, the first reference transistor M7 may be an NMOS. The discharging detector 502_DET_2 is configured to determine a second division voltage V2 according to a discharging current of the output stage 502_OS and a second bias voltage VBP, wherein the second bias voltage VBP is generated by a second reference transistor M8 of the bias circuit BIAS. In an embodiment, the second reference transistor M8 may be a PMOS. The logic NAND is configured to determine the enabling signal EN according to the non-first voltage V1', the second division voltage V2 and an enabling pulse signal SPB, wherein the enabling pulse signal SPB is generated by a timing controller TCON.

The charging detector 502_DET_1 includes a first current source M1, a first current sink M3 and a logic NOT. The logic NOT is coupled to the first current source M1 and the first current sink M3, and is configured to determine the non-first voltage V1' according to a first division voltage V1 of the first current source M1 and the first current sink M3.

Since a voltage VGS of the first current source M1 and the first output transistor M5 are identical, a current mirror is formed, wherein a proportion of width and length of the first current source M1 and the first output transistor M5 is: (W1/L1): (W5/L5)=1:M, and M is a positive number. Similarly, a voltage VGS of the first current sink M3 and the first reference transistor M7 are identical, and a current mirror is formed, wherein a proportion of width and length of the first current sink M3 and the first reference transistor M7 is: (W3/L3):(W7/L7)=1:N, and N is a positive number.

Therefore, the first current source M1 and the first current sink M3 respectively reflect the charging current of the first output transistor M5 and a reference current Iref_1 of the first reference transistor M7.

The discharging detector 502_DET_2 includes a second current sink M2 and a second current source M4, and is configured to determine the second division voltage V2 according to the second current sink M2 and the second current source M4.

Since a voltage VGS of the second current sink M2 and the second output transistor M6 are identical, a current mirror is formed, wherein a proportion of width and length of the second current sink M2 and the second output transistor M6 is: (W2/L2): (W6/L6)=1:M, and M is a positive number. Similarly, a voltage VGS of the second current source M4 and the second reference transistor M8 are identical, a current mirror is formed, wherein a proportion of width and length of the second current source M4 and the second reference transistor M8 is: (W4/L4):(W8/L8)=1:N, and N is a positive number.

Therefore, the second current sink M2 and the second current source M4 respectively reflect the discharging current of the second output transistor M6 and a reference current Iref_2 of the second reference transistor M8.

Figure 6:
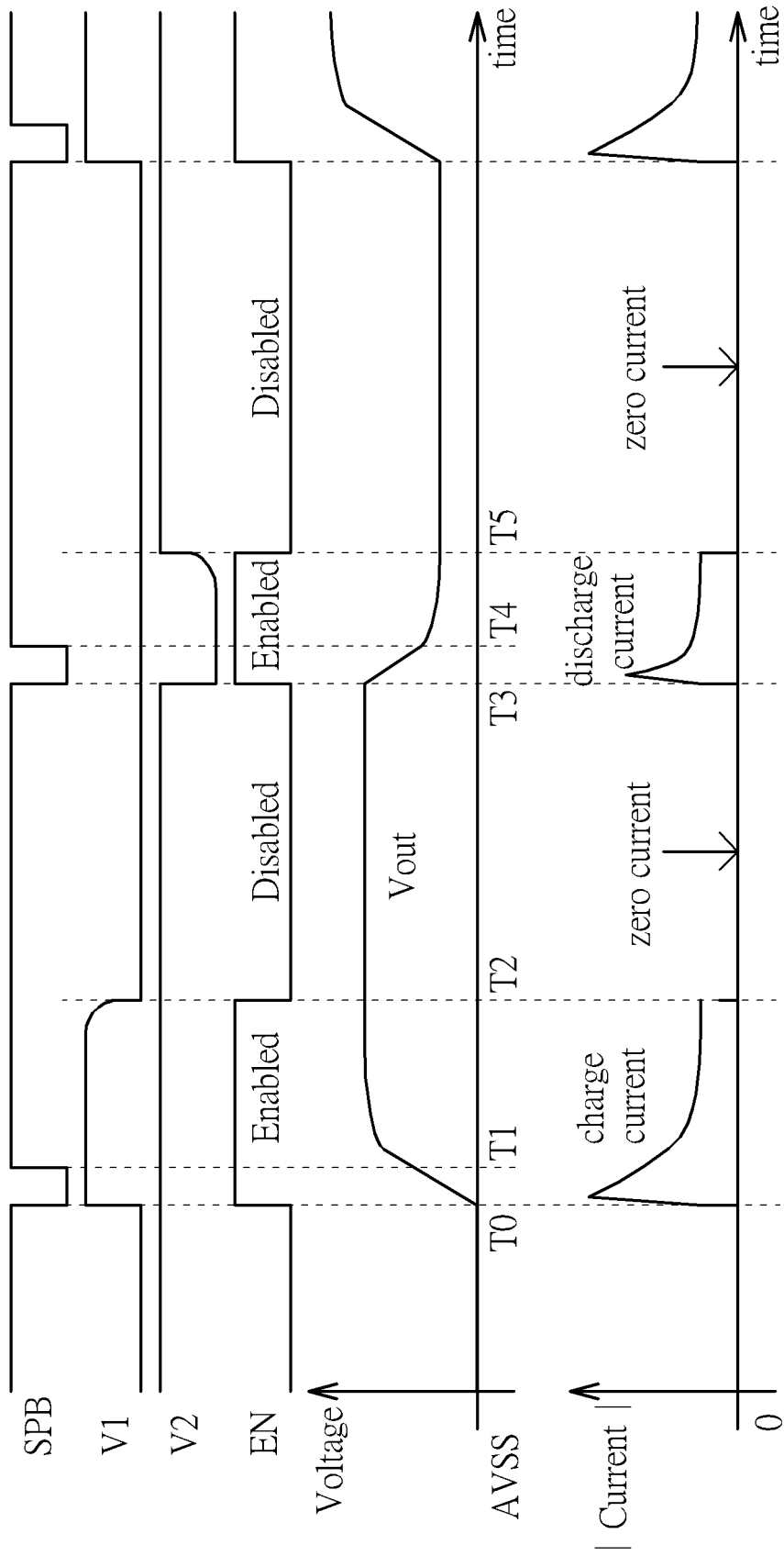
FIG. 6 is a schematic diagram of signal waveforms of the output buffer in FIG. 5 according to an embodiment of the present invention.

FIG. 6 is a schematic diagram of signal waveforms of the output buffer 502 in FIG. 5 according to an embodiment of the present invention. Notably, the current waveform shown in FIG. 6 is an absolute value of the current.

As shown in FIG. 6, the output voltage Vout of the output buffer 502 is varied in response to the current waveform, wherein the current waveform is related to a variation of the output voltage Vout.

Assume that M=N=1, at time T0, the enabling pulse signal SPB is low, the enabling signal EN is high, and the output buffer 502 is turned on, since the input voltage Vin is higher than the output voltage Vout, and the output buffer 502 charges the capacitor Cp of the pixel of the panel. In other words, the first output transistor M5 outputs the charging current and the second output transistor M6 does not work. In such a situation, the first division voltage V1 and the second division voltage V2 are both at a high voltage level.

At time T1, the enabling pulse signal SPB is high, the second division voltage V2 is high, and the enabling signal EN is determined by the voltage level of the first division voltage V1.

At time T2, the charging current of the first current source M1 is smaller than the reference current Iref_1 reflected by the first current sink M3, the first division voltage V1 is reduced, the enabling signal EN is low, and the output buffer 502 is turned off.

At time T3, the enabling pulse signal SPB is low, the enabling signal EN is high and the output buffer 502 is turned on again for charging the following pixel of the panel. Since the input voltage Vin is smaller than the output voltage Vout, the output buffer 502 discharges the capacitor Cp of the pixel of the panel. In other words, the first output transistor M5 does not work and the second output transistor M6 outputs the discharging current. In such a situation, the first division voltage V1 and the second division voltage V2 are both at a low voltage level.

At time T4, the enabling pulse signal SPB is high, the first division voltage V1 is low, and the enabling signal EN is determined by the voltage level of the second division voltage V2.

At time T5, the discharging current of the second current sink M2 is smaller than the reference current Iref_2 reflected by the second current source M4, the second division voltage V2 is increased and the enabling signal EN is low, and the output buffer 502 is turned off.

Therefore, with the detector 502_DET, the output buffer 502 according to an embodiment of the present invention is turned on/off after the output buffer 502 finishes charging/discharging the capacitor of the pixel of the panel, which reduces the power consumption of the output buffer 502.

Figure 7:
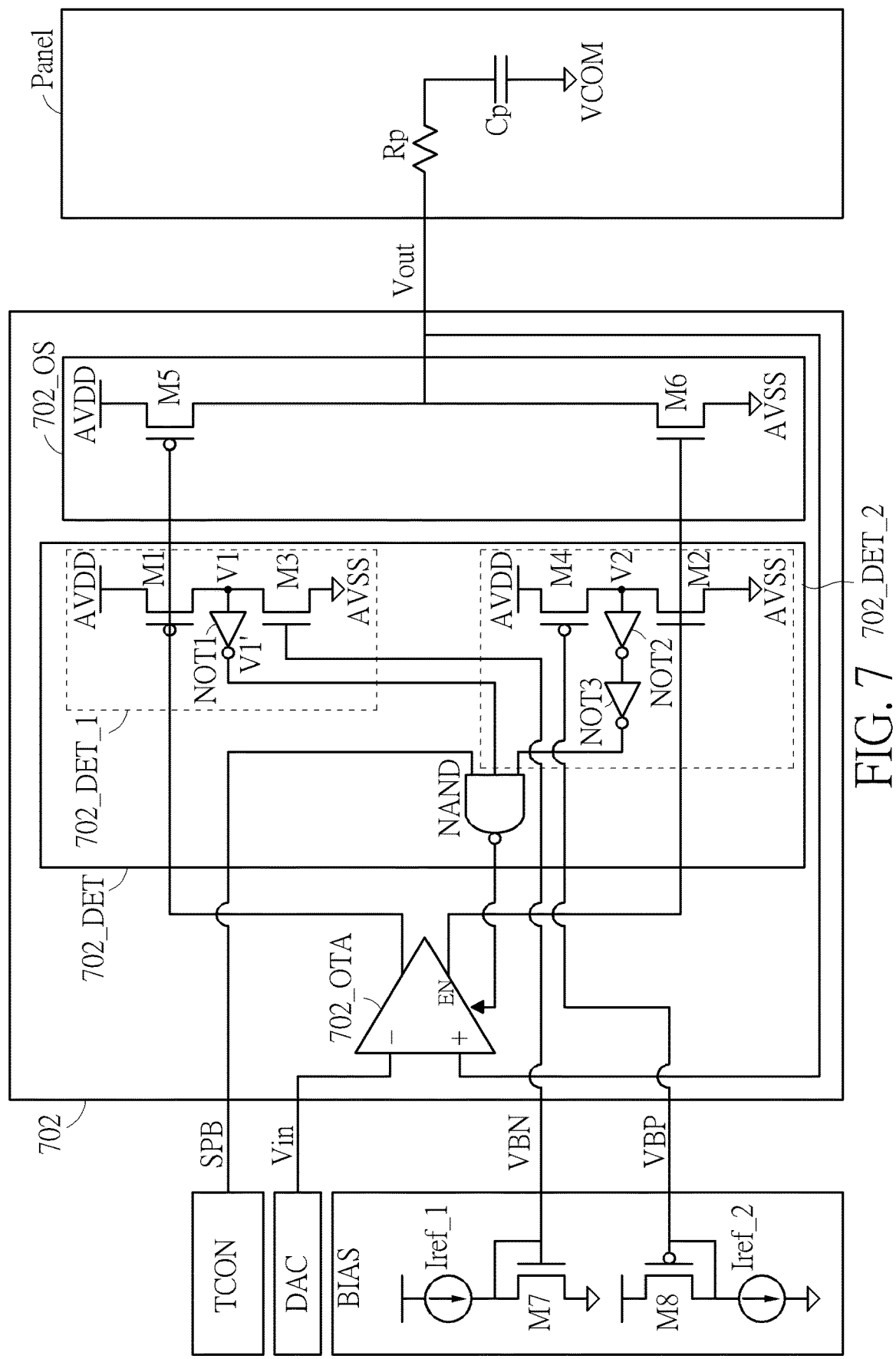
FIG. 7 is a schematic diagram of an output buffer according to an embodiment of the present invention.

Refer to FIG. 7, which is a schematic diagram of an output buffer 702 according to an embodiment of the present invention. The output buffer 702 is an alternative embodiment of the output buffer 502. The output buffer 702 includes an output stage 702_OS, an OTA 702_OTA and a detector 702_DET, wherein the detector 702_DET includes a charging detector 702_DET_1, a discharging detector 702_DET_2 and a logic NAND. The charging detector 702_DET_1 includes a first current source M1, a first current sink M3 and a first logic NOT NOT1. The discharging detector 702_DET_2 includes a second current sink M2, a second current source M4, a second logic NOT NOT2 and a third logic NOT NOT3. The second logic NOT NOT2 is coupled to the second current source M4 and the second current sink M2, the third logic NOT NOT3 is coupled to the second logic NOT NOT2. In this embodiment, the second voltage V2 is determined according to the second current source M4 and the second current sink M2.

In this embodiment, the second logic NOT NOT2 and the third logic NOT NOT3 are utilized for increasing a voltage gain of the second division voltage V2 and reducing a transition time of the output buffer 702.

Notably, the detailed operation method of the output buffer 702 can be referred to the output buffer 502 and not narrated herein for brevity.

Figure 8:
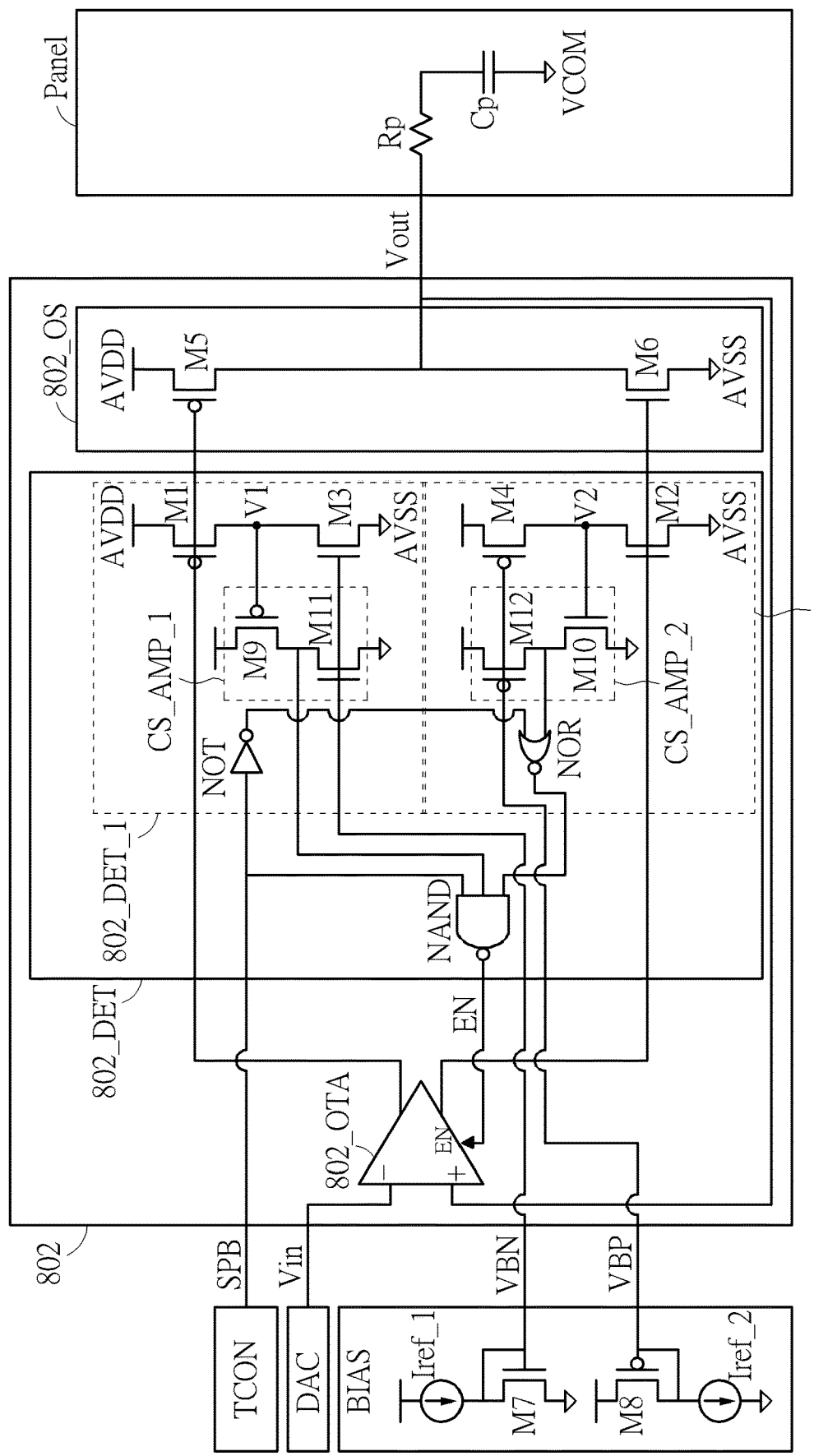
FIG. 8 is a schematic diagram of an output buffer according to an embodiment of the present invention.

Refer to FIG. 8, which is a schematic diagram of an output buffer 802 according to an embodiment of the present invention. The output buffer 802 is an alternative embodiment of the output buffer 502. The output buffer 802 includes an output stage 802_OS, an OTA 802_OTA and a detector 802_DET, wherein the detector 802_DET includes a charging detector 802_DET_1, a discharging detector 802_DET_2 and a logic NAND. The charging detector 802_DET_1 includes a first current source M1, a first current sink M3 and a first common source amplifier CS_AMP_1, wherein the first common source amplifier CS_AMP_1 includes transistors M9 and M11, and the first common source amplifier CS_AMP_1 is coupled to the first current source M1 and the first current sink M3. In an embodiment, the transistor M9 may be a PMOS and the transistor M11 may be an NMOS. The discharging detector 802_DET_2 includes a second current sink M2, a second current source M4 and a second common source amplifier CS_AMP_2, wherein the second common source amplifier CS_AMP_2 includes transistors M10 and M12, and is coupled to the second current source M4 and the second current sink M2. In an embodiment, the transistor M10 may be an NMOS and the transistor M12 may be a PMOS.

In this embodiment, the first common source amplifier CS_AMP_1 and the second common source amplifier CS_AMP_2 are configured to increase the voltage gain. In addition, since the enabling pulse signal SPB is output to the logic NOR via the logic NOT, the transition current of the output buffer 802 may be reduced.

Notably, the detailed operation method of the output buffer 802 can be referred to the output buffer 502 and not narrated herein for brevity.

In summary, the present invention provides an output buffer, which is turned off after charging/discharging a capacitor of a pixel of a panel to reduce power consumption of a display driver.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output buffer for a source driver of a panel, comprising:
    an output stage, configured to output an output voltage;
    an operational transconductance amplifier (OTA), configured to control the output stage to charge or discharge a capacitor of a pixel of the panel; and
    a detector, coupled between the OTA and the output stage, configured to output an enabling signal to turn on/off the output buffer after the output buffer finishes charging or discharging the capacitor of the pixel of the panel, wherein the enabling signal is determined according to an output current of the output stage;
    wherein the detector comprises:
        a charging detector, configured to determine a non-first voltage according to a charging current of the output stage and a first bias voltage of the bias circuit; and
        a discharging detector, configured to determine a second division voltage according to a discharging current of the output stage and a second bias voltage of the bias circuit.

2. The output buffer of claim 1, further comprising:
    a bias circuit, configured to provide a first bias voltage and a second bias voltage to the detector; and
    a timing controller, configured to provide an enabling pulse signal to the detector.

3. The output buffer of claim 1, wherein the detector further comprises:
    an logic NAND, configured to determine the enabling signal according to the non-first voltage, the second voltage and the enabling pulse signal.

4. The output buffer of claim 1, wherein the charging detector comprises:
    a first current source;
    a first current sink; and
    a logic NOT, coupled to the first current source and the first current sink, configured to determine the non-first voltage according to the first current source and the first current sink.

5. The output buffer of claim 4, wherein when a charging current of the first current source of the charging detector is smaller than a reflected current of the first current sink, the output buffer is turned off.

6. The output buffer of claim 4, wherein the first current source and a first output transistor of the output stage forms a current mirror, and the first current sink and a first reference transistor of the bias circuit forms a current mirror.

7. The output buffer of claim 1, wherein the discharging detector comprises:
a second current sink; and
a second current source;
wherein the second division voltage is determined according to the second current source and the second current sink.

8. The output buffer of claim 7, wherein when a discharging current of the second current sink of the discharging detector is smaller than a reflected current of the second current source, the output buffer is turned off.

9. The output buffer of claim 7, wherein the second current source and a second reference transistor of the bias circuit forms a current mirror, and the second current sink and a second output transistor of the output stage forms a current mirror.

10. The output buffer of claim 1, wherein the OTA is configured to compare an input voltage and an output voltage of the output buffer to charge or discharge the capacitor of the pixel of the panel when the output buffer is turned on.

11. The output buffer of claim 10, wherein when the input voltage is higher than the output voltage, the output buffer charges the capacitor of the pixel of the panel, a first output transistor of the output stage is configured to output a charging current.

12. The output buffer of claim 10, wherein when the input voltage is lower than the output voltage, the output buffer discharges the capacitor of the pixel of the panel, a second output transistor of the output stage is configured to output a discharging current.

13. The output buffer of claim 1, wherein the discharging detector comprises:
a second current sink;
a second current source;
a second logic NOT, coupled to the second current source and the second current sink; and
a third logic NOT, coupled to the second logic NOT;
wherein the second division voltage is determined according to the second current source and the second current sink.

14. The output buffer of claim 1, wherein the charging detector comprises:
a first current source;
a first current sink; and
a first common source amplifier, coupled to the first current source and the first current sink, configured to increase a voltage gain.

15. The output buffer of claim 1, wherein the discharging detector comprises:
a second current sink;
a second current source;
a second common source amplifier, coupled to the second current source and the second current sink, configured to increase a voltage gain; and
a logic NOR, coupled between the second common source amplifier and the logic NAND, configured to reduce a transition current.

16. The output buffer of claim 1, wherein a static current of the output buffer is around zero when the output buffer is turned off after the output buffer finishes charging or discharging the capacitor of the pixel of the panel.

* * * * *